United States Patent [19]
Lipscombe

[11] 3,983,512
[45] Sept. 28, 1976

[54] CURRENT CONTROLLED ELECTRICAL CIRCUITS

[75] Inventor: William Mark Lipscombe, Haywards Heath, England

[73] Assignee: Feedback Instruments Limited, England

[22] Filed: Aug. 22, 1975

[21] Appl. No.: 606,764

[30] Foreign Application Priority Data
Aug. 27, 1974 United Kingdom............... 37397/74

[52] U.S. Cl. ........................... 331/108 B; 307/262; 307/295; 331/135; 331/137; 331/177 R; 333/80 T; 333/70 CR
[51] Int. Cl.²......................................... H03B 5/24
[58] Field of Search .............. 331/108 B, 110, 137, 331/177, 135; 333/80 T, 70 CR; 307/262, 295

[56] References Cited
UNITED STATES PATENTS

| | | | |
|---|---|---|---|
| 3,070,762 | 12/1962 | Evans | 333/70 CR |
| 3,289,102 | 11/1966 | Hayashi | 331/137 |
| 3,829,795 | 8/1974 | Minney | 331/108 D |

FOREIGN PATENTS OR APPLICATIONS

| | | | |
|---|---|---|---|
| 1,120,592 | 2/1966 | United Kingdom | 331/110 |

*Primary Examiner*—John Kominski
*Attorney, Agent, or Firm*—William Anthony Drucker

[57] ABSTRACT

A resonant circuit is provided with a number of phase shift circuits connected in series. A control circuit is connected in series with the phase shift circuits for controlling the direct current flowing through the circuits. One of the phase shift circuits is constructed of a pair of transistors interconnected by a capacitor. The emitter resistance of the transistors is determined by the direct currents flowing therethrough from the control circuit, whereupon the frequency of oscillation or resonance of the resonant circuit is dependant upon the emitter resistance.

17 Claims, 7 Drawing Figures

CURRENT CONTROLLED ELECTRICAL CIRCUITS

BACKGROUND TO THE INVENTION

This invention relates to an electrical circuit such as an oscillator or a resonant circuit which is controllable by the application of a control voltage or current to provide a sinusoidal output signal having a voltage of constant amplitude.

Oscillators are, of course, known which generate a sinusoidal output of constant voltage amplitude, the frequency of which can be controlled by a voltage or current so that the relationship between the frequency generated and the control voltage is either fundamentally linear or logarithmic. The frequency range of control of such oscillators may extend over several decades. However, such oscillators are at present achieved in commercial instruments with considerable circuit complexity and often are only operative over a limited frequency range, for example 0.01 Hz to 20 MHz.

Resonant circuits are commonly known in the form of a capacitor/inductance circuit. However, such resonant circuits are not readily adaptable to integrated circuit form and in this field other techniques have to be used to provide resonant circuits.

SUMMARY OF THE INVENTION

According to the present invention, there is provided a resonant circuit including a plurality of series connected balanced phase shift circuits, means connected in series with the phase shift circuits for supplying balanced direct currents to the balanced phase shift circuits, one of said phase shift circuits comprising a pair of transistors interconnected by a capacitor wherein the control means is effective to define the direct current flowing through the transistors, the emitter resistance of the transistors and hence the frequency of oscillation of the circuit or the frequency at which the circuit resonates. Therefore, the resonant circuit may be either in a state of oscillation or not.

In one embodiment the resonant circuit is incorporated in an electrical circuit including an amplifier, and three series connected balanced phase shift circuits interconnected between the input and output of the amplifier. The control means is connected in series with the phase shift circuits between terminals connectible to a voltage source and at least two of the phase shift circuits each comprising a pair of transistors interconnected by a capacitor. The phase shift circuits provide a positive feedback path between the output and input of the amplifier.

More particularly, the output of the amplifier is connected to the base electrodes of a pair of drive transistors, the emitter electrodes of these drive transistors being interconnected and together further connected with the control means. The capacitor of a first phase shift circuit is connected between the collector electrodes of the pair of drive transistors and the emitters of a second pair of transistors.

A second phase shift circuit, constituted by a third pair of transistors and a second capacitor, is connected by the emitter electrodes of the third transistors to respective collector electrodes of the second pair of transistors, the second capacitor being connected between the emitter electrodes of the third pair of transistors.

A third phase shift circuit, constituted by a fourth pair of transistors and a third capacitor, is connected to the second phase shift circuit in the same manner as the second circuit is connected to the first circuit, the input to the amplifier being connected across the third capacitor.

In another embodiment of the present invention the fourth pair of transistors are replaced by a pair of diodes.

The control means may take the form of a fixed resistor, a variable resistor to enable the current and hence the frequency of the oscillator to be varied, or a control circuit operable in response to a control voltage.

BRIEF DESCRIPTION OF DRAWINGS

Embodiments of the present invention will now be described by way of example with reference to the accompanying drawings, in which.

DESCRIPTION OF PREFERRED EMBODIMENT

Figure 1:
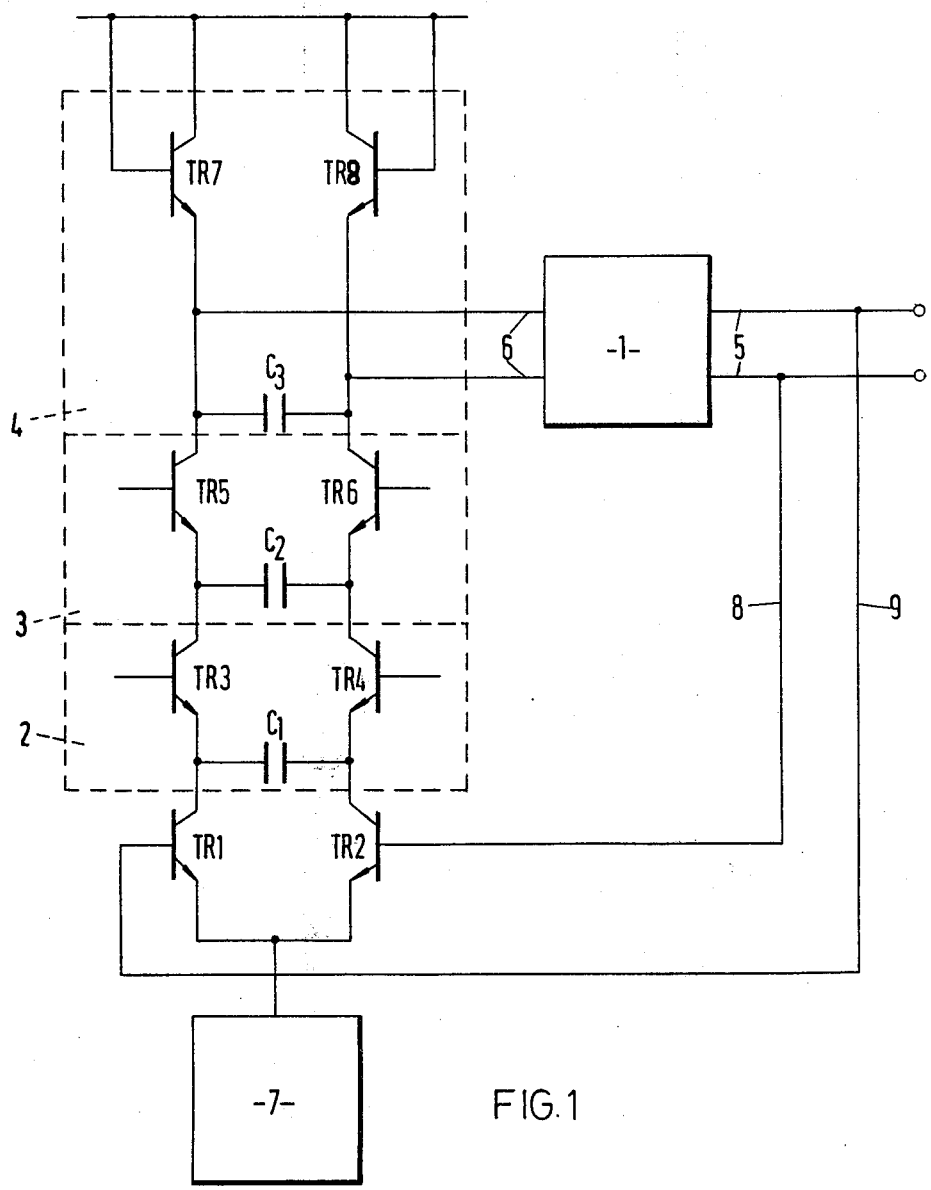
FIG. 1 shows a schematic diagram of a balanced resonant circuit according to the invention.

Referring now more particularly to FIG. 1, there is shown an oscillator including an amplifier 1, three balanced phase shift circuits 2, 3, 4 interconnected between the output 5 and input 6 of the amplifier. Connected to the input of the phase shift circuit 2 there is connected a pair of transistors TR1, TR2 which are in turn connected to a direct current control circuit 7.

The amplifier 1 in this embodiment is an amplifier having a constant gain and zero phase shift between the input and output thereof. The output 5 is connected by means of leads 8, 9 to the base electrodes of transistors TR2, TR1 respectively, which transistors have interconnected emitter electrodes, and by which they are connected to the current control circuit 7.

The first phase shift circuit 2 is formed by transistors TR3, TR4 and capacitor C1. The emitter electrodes of these latter transistors are connected to the collector electrodes of transistors TR1, TR2 respectively, while the capacitor C1 is connected between the emitter electrodes of transistors TR3, TR4.

As seen from the drawing, the second phase shift circuit 3, comprising transistors TR5, TR6 and capacitor C2, is connected to the first phase shift circuit 3 in the same manner as the latter is connected to the pair of transistors TR1, TR2.

The third phase shift circuit comprises transistors TR7, TR8 and capacitor C3 connected between the emitter electrodes thereof. The emitter electrodes of these latter transistors are respectively connected to the collector electrodes of transistors TR5, TR6, while their base and collector electrodes are joined together. It will be understood that while the emitter input resistance, as hereinafter described, is used to effect a change in the frequency of the oscillator, the transistors TR7, TR8 may be replaced by diodes. The forward conducting resistance of which diodes varies in a manner similar to that of the emitter input resistance, and, therefore, has no undue effect on the operation of the oscillator.

The input to the amplifier 1 is provided by connecting the input 6 to the respective collector electrodes of transistors TR5, TR6, that is, across the capacitor C3.

The control circuit 7 which, as mentioned above, is connected to the interconnected emitter electrodes of transistors TR1, TR2, serves to control the flow of current through the phase shift circuits. This phase shift network is connected via transistors TR7, TR8 to a direct current voltage source (not shown) which may be 4 volts for example. The base electrodes of transistors TR5, TR6 are suitably connected to the voltage source so as to have applied thereto a voltage of 2 volts, while the base electrodes of transistors TR3, TR4 are held at zero volts. The variation of base voltages between stages ensures that the collector electrodes of each stage have adequate voltages thereon to enable proper transistor operation.

The control circuit 7 may take the form of a fixed resistor, a variable resistor or a voltage controlled circuit.

In order to understand the operation of this circuit, it is to be noted that the oscillator circuit is essentially a commonly known ladder phase shift circuit with overall feedback of the resistance/capacitance type of oscillator.

It is well known in transistor technology that the emitter input impedance is essentially a non-linear resistance which is dependant upon the current flowing through the transistor.

The current-resistance relationship is well defined and is used in the above described oscillator circuit to control the emitter input resistance. Therefore, each transistor can be considered as a resistive element corresponding to the resistive part of a resistor/capacitance (R/C) oscillator. The emitter input resistance may for example vary in the range 25 ohms to 250,000 ohms, i.e., a ratio of 10,000:1, depending upon the quality of the transistors used. Such a range of variation of the emitter input resistance, with a suitable value of capacitance in the example described, will result in an output frequency range of 5.5 Hz to 55 kHz.

The operation of the circuit shown in the drawing is substantially identical to the known operation of a ladder phase shift R/C oscillator in that the output of the amplifier 1 is fed, via the phase shift circuits 2,3,4 back into the input of the amplifier in the correct phase relationship. The essential difference of the present circuit resides in the fact that the resistive element of the presently described oscillator is set in dependance upon the current control circuit 7.

Therefore, since the controlling current drawn through the circuit passes through all the transistors in the circuit, the effective emitter resistance of all the transistors is set simultaneously.

Consequently, at one particular current level, the oscillator can provide an output voltage having a constant amplitude and a constant frequency. Alternatively, the current through the transistors can be altered selectively to provide an output signal having a selectable frequency. In another form the current through the transistors can be continuously varied simultaneously to provide a continuous sweep of frequencies in a particular range.

As in all oscillators, the aim here is to take a part of the output signal of the amplifier 1 and feed it back to the amplifier input in phase with the input signal thereof. In the presently described embodiment each stage or phase shift circuit contributes 60° of phase shift so that the total phase shift is 180°. However, the base-collector circuit of transistors TR1, TR2 provide another 180° of phase shift and added to the 180° phase shift provided by the circuits 2, 3, 4, total phase shift of 360° is obtained. This is the total phase shift required in this embodiment to obtain oscillation.

In each of the phase shift circuits which are effectively low-pass resistance-capacitance filter elements, there is a reduction in the signal amplitude by a factor of 2 resulting in a total reduction by a factor of approximately 8. To ensure that the circuit oscillates this attenuation is compensated by the amplifier 1.

Although the above described oscillator circuit has been described as having a phase shift network contributing 360° of phase shift while the amplifier provides 0° phase shift, it is of course possible for the phase shift network to provide only 180° phase shift with the amplifier also providing 180° phase shift.

The oscillator of the present invention advantageously provides an output signal which is sinusoidal, of constant voltage amplitude and may have a variable frequency within the range 0.01 Hz to 100 MHz either swept or selectively. The distortion in the output sinusoidal waveform is kept to a minimum in the present oscillator by maintaining a low amplitude of oscillation. However, off-setting the emitter resistance increase in one transistor, due to the instantaneous signal voltages, to a first order by the decrease in the emitter resistance of the other transistor of a balanced pair of transistors of one phase shift stage, and attenuating higher frequency components severely in the phase shift circuitry are inherent features from the circuit construction which also serve to keep the distortion to a minimum.

In an alternative embodiment of the oscillator according to the invention the phase shift circuits need not be limited to three but four or more such circuits may be provided, the criteria being, of course, that the signal applied to the input of the amplifier is in phase with the amplifier input. Furthermore, the transistors TR7, TR8 can be replaced by diodes and although the transistors illustrated are NPN type, PNP type and combinations of both types can be utilised.

Although the above disclosed embodiment has been described as having a frequency range of 5.5 Hz to 55 kHz, the circuitry described may be constructed to provide a frequency variation ratio of 10,000:1 or more, and may be used at frequencies from 0.01 Hz to 100 MHz.

While the above circuitry can be constructed from discrete components, it is envisaged that such a circuit will readily lend itself to integrated circuit technology and be ideally suited to construction in integrated circuit form.

Because this circuit is readily adaptable to integrated circuit form, the circuit construction lends itself advantageously to use as a resonant circuit for integrated circuits. In essence, all that is needed to operate the above described oscillator as a resonant circuit is to arrange for the effective loop gain of the oscillator circuit to be less than unity. The circuit then exhibits frequency dependant characteristics similar to a conventional inductance and capacitance tuned circuit. The reduction in loop gain of the oscillator circuit can be achieved in two ways:— either by reducing the gain (in the example given) of the amplifier to less than 8, or by arranging that the three capacitors in the circuit are not all equal, i.e., increasing the value of one of them by perhaps 10 or 20%.

Figure 2:
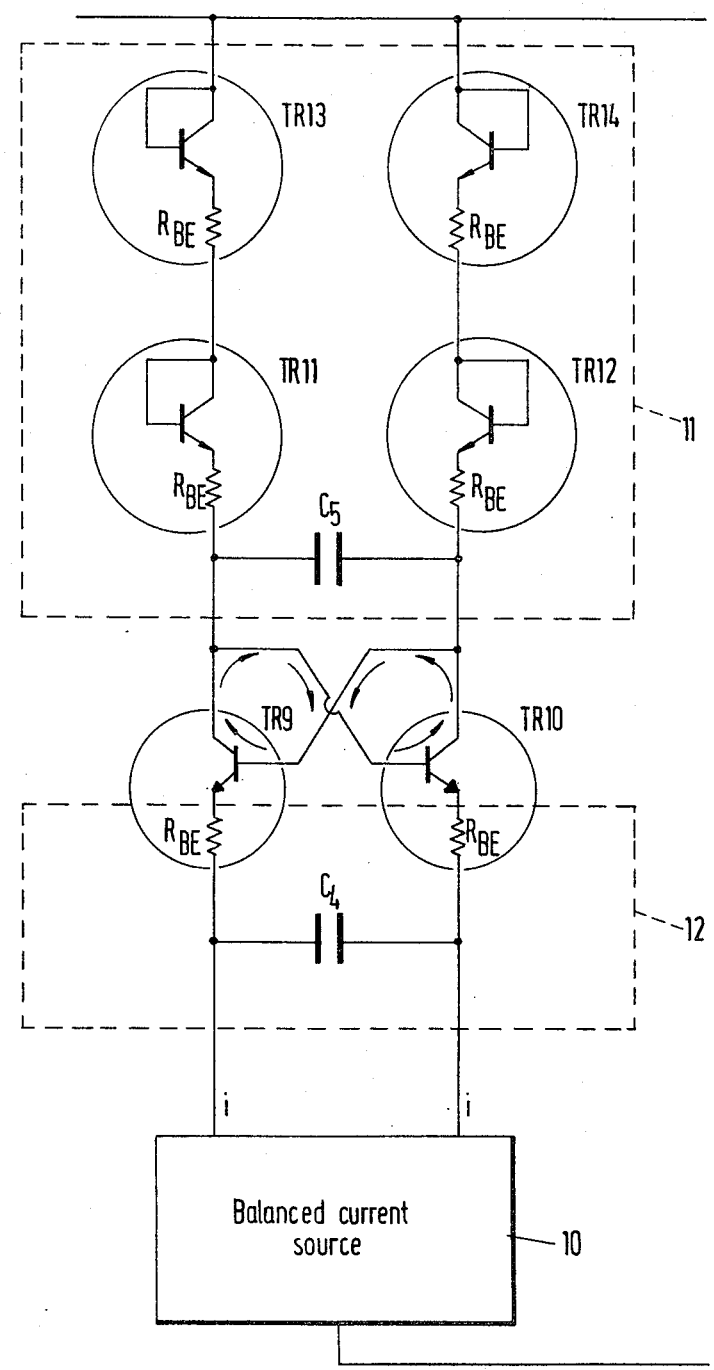
FIG. 2 shows a schematic diagram of another balanced resonant circuit according to the invention.

A typical resonant circuit is shown in FIG. 2. The resonant circuit comprises a balanced current source 10, a pair of transistors TR9, TR10 having their emitters connected to the respective outputs of the current source 10, which emitters are interconnected by means of a capacitor C4, and a phase retard circuit 11 connected to the collectors of the transistors TR4, TR10. A phase advance circuit 12 is defined by capacitor C4 and the base-emitter resistance $R_{BE}$ (shown as resistors in FIG. 2) of transistors TR4, TR10. As can be seen from FIG. 2, the base of transistor TR9 is connected with the collector of the transistor TR10 while the base of transistor TR10 is connected with the collector of transistor TR9. The phase retard circuit comprises a balanced pair of two series connected transistors TR11 to TR14, of which the emitter electrodes of transistors TR11, TR12 are interconnected by a capacitor C5 which has a value one half of that of capacitor C4. The base of each of these transistors is connected to its collector so that the transistors act as diodes.

Figure 5:
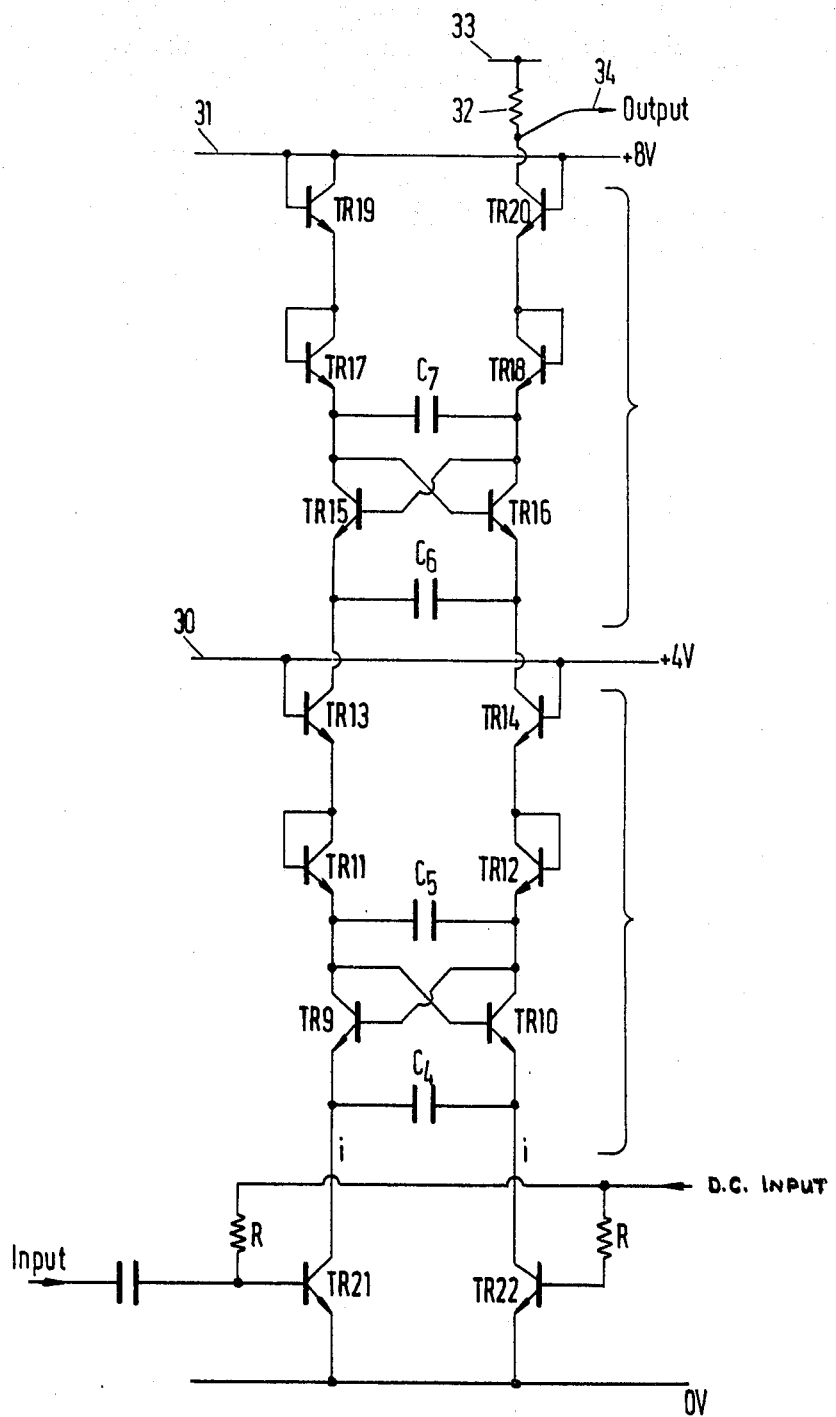
FIG. 5 shows a schematic diagram of a circuit using two balanced resonant circuits as shown in FIG. 2, controlled by a single direct current control circuit.

The balanced current source 10 may comprise a pair of balanced transistors having their emitters connected to a zero voltage supply line and their collectors connected to the respective emitters of the transistors TR9, TR10. The base electrodes of the current source transistors are interconnected by means of resistors, the junction of which resistors receives a direct current voltage signal for controlling the current through the balanced pair of transistors and allowing the balanced current source to provide to the balanced resonant circuit balanced direct currents. The alternating current input to the circuit is applied through a capacitor to the base electrodes of the balanced pair of transistors. Such a circuit is shown in FIG. 5.

This circuit has a very attractive basic simplicity which makes it particularly easy to use. Both phase shifters (advance and retard) introduce a loss. The total loss of these two combined has a minimum value of 2 and this occurs where each circuit produces a 45° phase shift. The loss of a factor of 2 is made up by doubling the impedance of the phase retarding circuit 11. This is done by using the two transistors TR11, TR13 and TR12,TR14 in series each side and halving, as indicated above, the associated phase shifting capacitor C5. In fact, due to the finite current gain inherent in the transistors used, the circuit is not quite critical and hence behaves as a resonant circuit with a good Q, i.e., in the order of 50. The circuit is attractive in that there are no extra coupling components or D.C. levels to be allowed for. It can also be used with a current input and a current output enabling two or more such circuits to be connected in series using the same controlling current.

Figure 3:
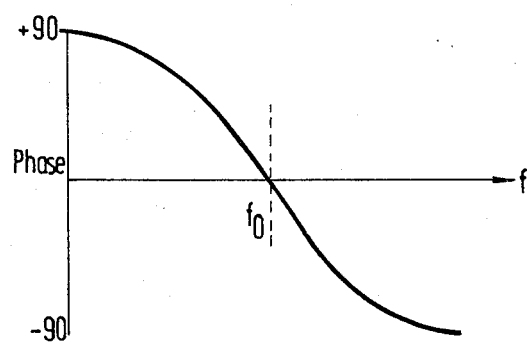
FIG. 3 shows phase advance/retard characteristics.

In the present embodiment, as mentioned above, the phase advance and retard circuits provide a 45° phase advance and a 45° phase retard so that the net result of the two circuits is thus zero phase change. This might seem at first sight to be the same as a direct connection and this is so, but at only one critical frequency, notably the resonant frequency. These phase changing circuits provide an overall frequency/phase characteristic as shown in FIG. 3, in which the phase of the output voltage relative to the input voltage is zero at the resonant frequency fo. Such characteristics are particularly applicable to FIG. 6.

The two circuits act as phase advance and phase retard circuits because of the connection of the phase shift circuit relative to the transistors as amplifiers. In fact, the R.C. circuit in the collectors is a parallel circuit in that the collector current is shared between the $R_{BE}$ path and the C5 (C4/2) path, whereas the emitter circuit is a series circuit in that the emitter current flows through $R_{BE}$ and also into C4. This distinction accounts for the different response characteristics shown on the graphs but it is the connection relative to the transistor which accounts for the phase advancing or retarding of the signal.

Figure 4:
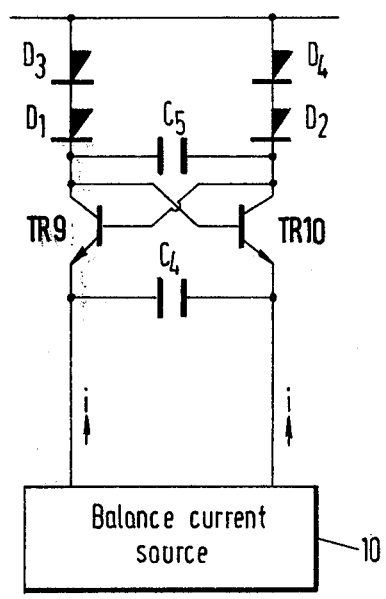
FIG. 4 shows a modified form of the circuit of FIG. 2.

In another embodiment, shown in FIG. 4, in which like parts have the same reference numerals as in FIG. 2, the transistors TR11 to TR14 have been replaced by diodes D1 to D4. The circuit otherwise operates in the same manner as FIG. 2.

In a further embodiment shown in FIG. 5, there is illustrated a practical form of resonant circuit in which two of the circuits shown in FIG. 2 are connected in series to provide increased selectivity. In the drawing, like parts have the same reference numerals as in FIG. 2.

In FIG. 5, the basic resonant circuit is shown with the base electrodes of transistors TR13, TR14 connected to a positive 4V supply line 30 and the collector electrodes thereof connected to the emitter electrodes of transistors TR15, TR16, a capacitor C6 being connected between these emitter electrodes. The remainder of this second circuit is connected in a similar manner as the first circuit except that the collector and base electrodes of transistor TR19 and the base electrode of transistor TR20 are connected to a positive 8V supply line 31, while the collector of transistor TR20 is connected to a resistor 32 which is in turn connected to a further voltage supply line 33. An output 34 is taken from the collector of transistor TR20. Preferably, all the transistors of the resonant circuits are type BC108.

FIG. 5 also illustrates a typical circuit of a balance current source, which circuit is identical to that described with reference to FIG. 2 and therefore will not be further described other than to specify that transistors TR21, TR22 are a balance pair of transistors from an RCA array type CA 3046. The base emitter resistance of each of the transistors in FIG. 5 has not been shown in the drawing.

The resonant circuits of FIGS. 2, 4 and 5 all operate in the same manner. Such operation is generally as follows:

A direct current voltage is applied to the bases of the balanced pair of transistors which form the balanced current source 10. This voltage controls the direct currents $i$ flowing through the resonant circuits and hence the frequency at which the circuits will resonate. An alternating current signal is applied to the base electrodes of the balanced transistors of the current source 10 and when this is at the correct frequency the circuit resonates. In FIG. 5, an output signal is taken from the output 34. Such an arrangement can equally well be applied to the circuits of FIGS. 2 and 4.

As previously mentioned, capacitor C4 and the emitter resistance $R_{BE}$ of transistors TR11, TR12 provide a 45° advance in the signal at the resonant frequency while the transistors TR9, TR10 because of their cross connections, each provide a 180° change in phase. The capacitor C5 and the emitter resistance $R_{BE}$ of transistors TR11, TR12 provide a 45° retardation in phase, thereby cancelling the effect of the phase advance at the resonant frequency.

Figure 6:
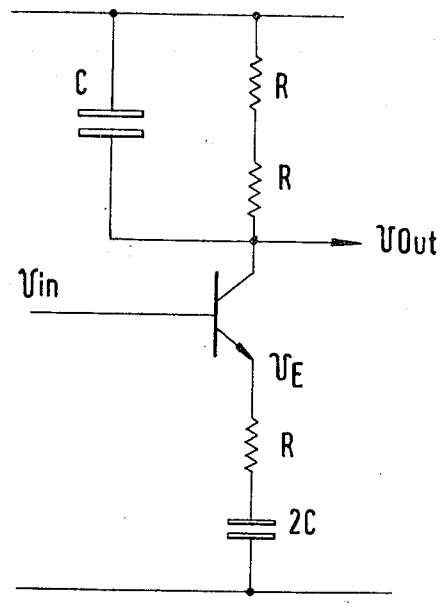
FIG. 6 is an equivalent diagram of one half of the balanced resonant circuit without the current control circuit.

The conditions for resonance of this solid state circuit having no inductive component can be explained as follows by considering the equivalent circuit of FIGS. 6 and 7 which show only one half of the balanced circuit. In FIG. 6, the resistances R are each equal to $R_{BE}$, while in FIG. 7, Z1 is the impedance representing the combination of the emitter components R and 2C of FIG. 6 and Z2 is the impedance representing the combination of the collector components C, R and R of FIG. 6. Thus, FIG. 6 is a special case of FIG. 7.

Figure 7:
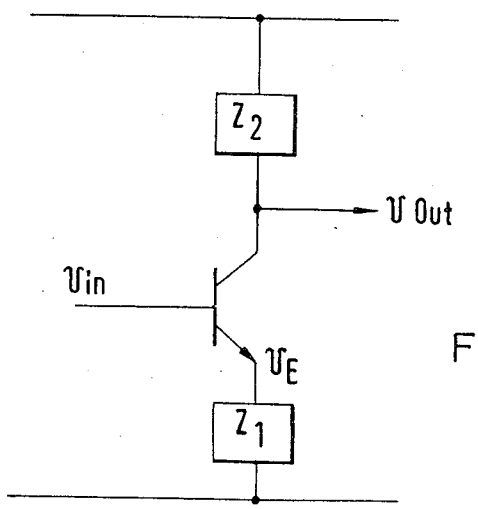
FIG. 7 is a simplified form of the equivalent circuit of FIG. 6.

Therefore, referring specifically to FIG. 7 and taking no account of the finite gain of the transistor, then if the transistor is perfect in FIG. 7

$$v_E = v_{in}$$

so the current in Z1 by ohms law is $$i = \frac{v_{in}}{Z1} \quad \text{(i)}$$

and $$v_{out} = iZ2 \quad \text{(ii)}$$

Therefore from (i) and (ii)

$$v_{out} = v_{in} \frac{(Z2)}{(Z1)}$$

thus the loss in the circuit is $$\frac{v_{in}}{v_{out}} = \frac{Z1}{Z2}$$

If the parallel RC combination of FIG. 6 is substituted for Z2 and the series RC combination is substituted for Z1, it can be shown algebraically that the loss $$\frac{v_{in}}{v_{out}} = 1 + j\left(wCR - \frac{1}{4wCR}\right)$$

Therefore the loss is a minimum with zero phase shift when $$j\left(wCR - \frac{1}{4wCR}\right) = 0$$

The resonant frequency is found by putting $$wCR - \frac{1}{4wCR} = 0$$

which can be resolved to $$fo = \frac{1}{4\pi RC}$$

Thus at this frequency and this alone the loss factor is one and thus the loop gain is unity resulting in a circuit with the exact conditions for oscillation. However, due to signal losses primarily associated with the finite current gain of the transistors, the circuit exhibits resonance but does not oscillate.

It can therefore be seen that the oscillator circuit of FIG. 1 and the resonant circuits of FIGS. 2, 4 and 5 all make use of the same circuit characteristic, namely controlling the value of emitter resistance $R_{BE}$ of a transistor by the direct current passing therethrough, where $R_{BE}$ is used in a balanced phase shift circuit, a concatenation of such circuits being used to produce a resonant circuit either in the state of oscillation or not.

The invention has been applied in one practical embodiment using the circuit of FIG. 5 in which the circuit, with suitable capacitors, was tunable through the commonly known long and medium wavebands of a broadcast receiver, and was the sole frequency selecting device in that receiver. The remainder of the receiver consisted of conventional non-selective amplifiers with a diode detector.

I claim:

1. A resonant circuit including a plurality of balanced phase shift circuits connected in series, a pair of transistors interconnected by a capacitor defining one of said phase shift circuits, and control means connected in series with the phase shift circuits for supplying balanced direct currents to the balanced phase shift circuits, wherein the control means is effective to define the direct current flowing through the transistors, the emitter resistance of the transistors and hence the frequency of oscillation of the circuit.

2. A circuit according to claim 1, including an amplifier and three series connected balanced phase shift circuits interconnected between the input and output of the amplifier.

3. A circuit according to claim 2, wherein the control means is connected in series with the phase shift circuits between terminals connectible to a voltage source, at least two of the phase shift circuits each comprising a pair of transistors interconnected by a capacitor.

4. A circuit according to claim 2, including a pair of drive transistors connected by their base electrodes to the amplifier, the emitter electrodes of said drive transistors being interconnected with each other and together further connected with the control means.

5. A circuit according to claim 4, wherein the capacitor of a first phase shift circuit is connected between the collector electrodes of the pair of drive transistors and the emitters of a second pair of transistors.

6. A circuit according to claim 5, wherein a second phase shift circuit constituted by a third pair of transistors and a second capacitor, is connected by the emitter electrodes of the third transistors to respective collector electrodes of the second pair of transistors, the second capacitor being connected between the emitter electrodes of the third pair of transistors.

7. A circuit according to claim 6, wherein a third phase shift circuit, constituted by a fourth pair of transistors and a third capacitor, is connected to the second phase shift circuit in the same manner as the second circuit is connected to the first circuit, the input to the amplifier being connected across the third capacitor.

8. A resonant circuit including a plurality of balanced phase shift circuits connected in series, a pair of transistors interconnected by a capacitor defining one of said phase shift circuits, and control means connected in series with the phase shift circuits for supplying balanced direct currents to the balanced phase shift circuits, wherein the control means is effective to define the direct current flowing through the transistors and hence the frequency at which the circuit resonates.

9. A circuit according to claim 8, including two phase shift circuits a first one of the phase shift circuits constituting a phase advance circuit and a second one constituting a phase retard circuit.

10. A circuit according to claim 8, wherein the two phase shift circuits each comprise a capacitor connected between the emitters of a pair of transistors.

11. A circuit according to claim 10, wherein a first pair of transistors associated with the first phase shift circuit have their collectors interconnected to the bases of the opposite transistor of said first pair of transistors.

12. A circuit according to claim 8, wherein the phase retard circuit comprises a balanced pair of series connected transistors, the base of each individual transistor being connected with the collector thereof.

13. A circuit according to claim 9, wherein the phase retard circuit comprises a balanced pair of series connected diodes interconnected by a capacitor.

14. A circuit according to claim 8, including two resonant circuits connected in series.

15. A circuit according to claim 8, wherein the control means comprises a variable resistor.

16. A circuit according to claim 8, wherein the control means comprises a control circuit.

17. A circuit according to claim 16, wherein the control circuit comprises a pair of balanced transistors arranged to be connected via their base circuits with a direct current source and via their collector circuits with the direct current inputs to a first phase shift circuit.

* * * * *